(12) United States Patent
Sunaga et al.

(10) Patent No.: US 6,545,932 B1
(45) Date of Patent: Apr. 8, 2003

(54) SDRAM AND METHOD FOR DATA ACCESSES OF SDRAM

(75) Inventors: Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/452,408

(22) Filed: Dec. 1, 1999

(30) Foreign Application Priority Data

Dec. 25, 1998 (JP) .......................................... 10-369849

(51) Int. Cl.[7] ................................................. G11C 8/00
(52) U.S. Cl. ................... 365/230.03; 365/233; 365/236
(58) Field of Search ............................ 365/230.03, 233, 365/236

(56) References Cited

U.S. PATENT DOCUMENTS

| 5,146,581 | A | * | 9/1992 | Kaneko | ........................... 711/5 |
| 6,069,829 | A | * | 5/2000 | Komai et al. | ................ 365/201 |
| 6,081,468 | A | * | 6/2000 | Taira et al. | .................. 365/203 |
| 6,088,292 | A | * | 7/2000 | Takahashi | ................... 365/233 |

* cited by examiner

Primary Examiner—David Nelms
Assistant Examiner—Gene N. Avduong
(74) Attorney, Agent, or Firm—Robert A. Walsh

(57) ABSTRACT

An SRAM which eliminates any seam in consecutive read/write data flows when the burst-length is short, thus making it possible to achieve a seamless access in the burst-mode against data of different row-addresses between banks. This operation enables the band-width of SDRAM to approximate the data transmission rate at the peak moment determined by the maximum frequency of the clock.

6 Claims, 9 Drawing Sheets

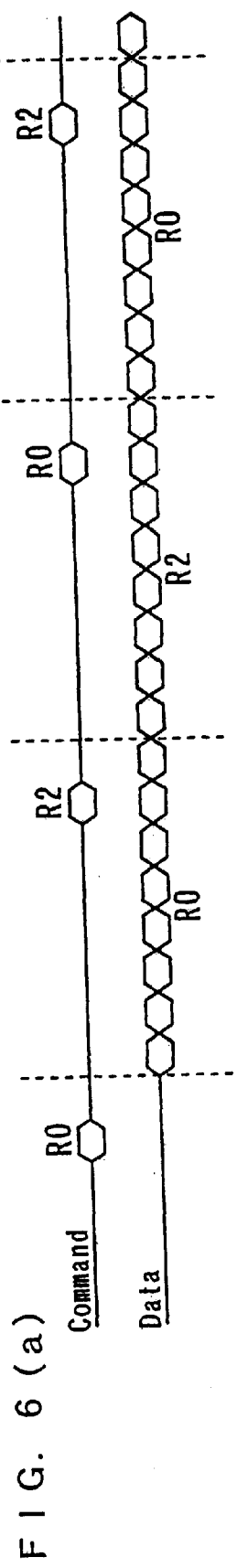
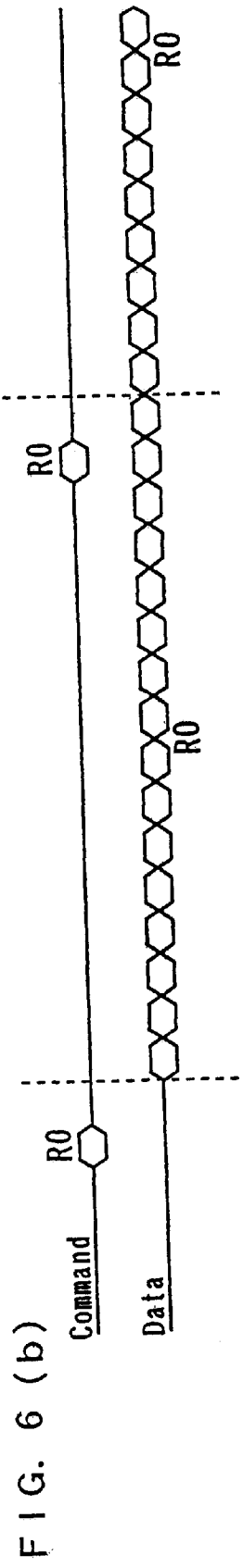
F I G. 6 (a)
F I G. 6 (b)

SDRAM AND METHOD FOR DATA ACCESSES OF SDRAM

FIELD OF THE INVENTION

The present invention relates to a synchronous DRAM (SDRAM) and a method for data accesses of an SDRAM.

BACKGROUND

In recent years, the progress of bandwidth of a DRAM (dynamic random access memory) has been preceded by the progress in speed of MPU (micro-processing unit), thus this has caused serious limitation on the improvement of the system performance. In a DRAM, reading and writing data is executed by specifying a row address and a column address among memory cells normally disposed in a matrix form. When a row address whose memory cell to be accessed has been specified, regardless of its column address, all the data in the specified row address are amplified by sense amplifiers. In succession, when a column address has been specified, the data corresponding to the specified column address are output among the data amplified by the sense amplifiers. A summary of data-read timing is generally illustrated in FIG. 7(a).

Further, when a row address has been specified, since all the data are amplified by sense amplifiers, in case of read data of the same row address in succession, the objective data have already been read by the sense amplifiers. Accordingly, in case of read data of the same row address in succession, specification of only a column address will suffice. A summary of data-read timing in this case can generally be understood as shown in FIG. 7(b). In the page mode for continuous data accesses of the same row, since it is not necessary to respecify the row address, data can be read out at higher speed than a conventional method shown in FIG. 7(a).

Likewise, a synchronous DRAM (SDRAM) has extensively been introduced for practical use. In an SDRAM, when a row address and a column address of the initial data have been specified, following addresses are automatically generated inside of a memory chip to generate data to be output in succession synchronous with the clock. A summary of data-read timing in this case is illustrated in FIG. 8. The number of data (burst length) output in succession can be selected by an optional number such as 2, 4, or 8. In the burst mode for data accesses synchronous with the clock, since data are accessible per clock, data can be read out at higher speed than the page mode shown in FIG. 7(b).

However, except for the data-output synchronous with clock, basically, the burst mode is similar to the conventional page mode, in which high-speed access is realized by specifying a column address against a number of sense amplifiers activated by a single row address. Accordingly, in the access against the same row address, reading speed is greatly improved. However, when accessing a different row address, data must newly be read into sense amplifiers, and thus, reading speed is not improved.

In order to improve the speed of accessing a different row address, each SDRAM comprises a plurality of memory banks. Each of the memory banks can function itself almost like an independent DRAM. It is so arranged that a decrease of the access speed can be curbed by activating or precharging other banks while accessing a bank.

However, in the above method, unless the burst length is long enough, latent time is generated in the access between banks to fail to become seamless like the case of accessing against a column of the same row. For example, in the case of such an SDRAM comprising 16 Mbit, 100 MHz, 3 of CAS (column address strobe) latencies, and 2 of banks (bank 1/bank 2), as shown in FIG. 9, when the burst length is rated to be 4, latency time corresponding to 3 clocks is generated in the course of accessing a different bank to cause the substantial data-transmission rate to be decreased to 73%(8/11) of the clock frequency. As a matter of course, when using a number of banks by increasing their number, basically, a seamless access can be realized.

Nevertheless, when the number of banks has been increased, it is necessary to provide a number of row-and-column access commands and row-precharge commands. For example, if the number of banks of 4-bit- burst shown in FIG. 9 is increased to 4 (bank 0~bank 3), latency time on the data bus is decreased. However, in the course of accessing bank 2 following bank 0 and bank 1, the timing of the row-address specifying command overlaps that of the pre-charge command of bank 0 to cause an access to bank 3 to be held awaiting by 1 clock. Further, because of the relationship between the command for specifying a column address of bank 2 and the precharge command of bank 1, as shown in FIG. 10, vacancy corresponding to 2 clocks is eventually generated to result in the failure to achieve a seamless access. when using a number of banks and short-length burst, a clock slot for sequentially accommodating all the commands is lost, which results in the failure to materialize the seamless access.

SUMMARY OF THE INVENTION

The object of the invention is to eliminate the latency time for a read/write of data generated when the burst-length is short whereby makes it possible to achieve a seamless access in the burst-mode against data of different row-addresses between banks to enable the band-width of SDRAM to approximate the data transmission rate at the peak moment determined by the maximum frequency of the clock.

The essential of the SDRAM in the present invention is that the SDRAM comprises a bank-specifying means for specifying a bank to be accessed, an address-specifying means for specifying an address of data to be accessed inside said bank to be accessed, a bank-changing means for varying a bank specified by the said bank-specifying means as per predetermined sequence, and an address-changing means for varying addresses specified by said address-specifying means across a predetermined number of data.

The essential of the method for accessing data of the SDRAM of the invention is that the method comprises a step of specifying a bank to be accessed, a step of specifying an address of data to be accessed inside of said accessible bank, a step of accessing said specified bank as per predetermined sequence, and a step of accessing data of said specified address inside said specified bank across a predetermined number of data.

In the SDRAM of the invention, an address inside of the same bank is increased across a burst-length portion. After the address of the initial bank has been increased by the burst-length portion, the sequence is shifted to the following bank to cause the address inside the bank to be increased across the burst-length portion. After completing access to the last bank, the access returns to the initial bank to cause the address inside the bank to be accessed from the continual portion of the address accessed in the last round. When completing the access to the bank, the bank is automatically precharged.

BRIEF DESCRIPTION OF THE DRAWINGS

FIGS. 6 (a) and (b) are timing charts illustrating another examples of data accesses (write) of the SDRAM shown in FIG. 1.

DESCRIPTION OF THE PREFERRED EMBODIMENTS

Figure 1:
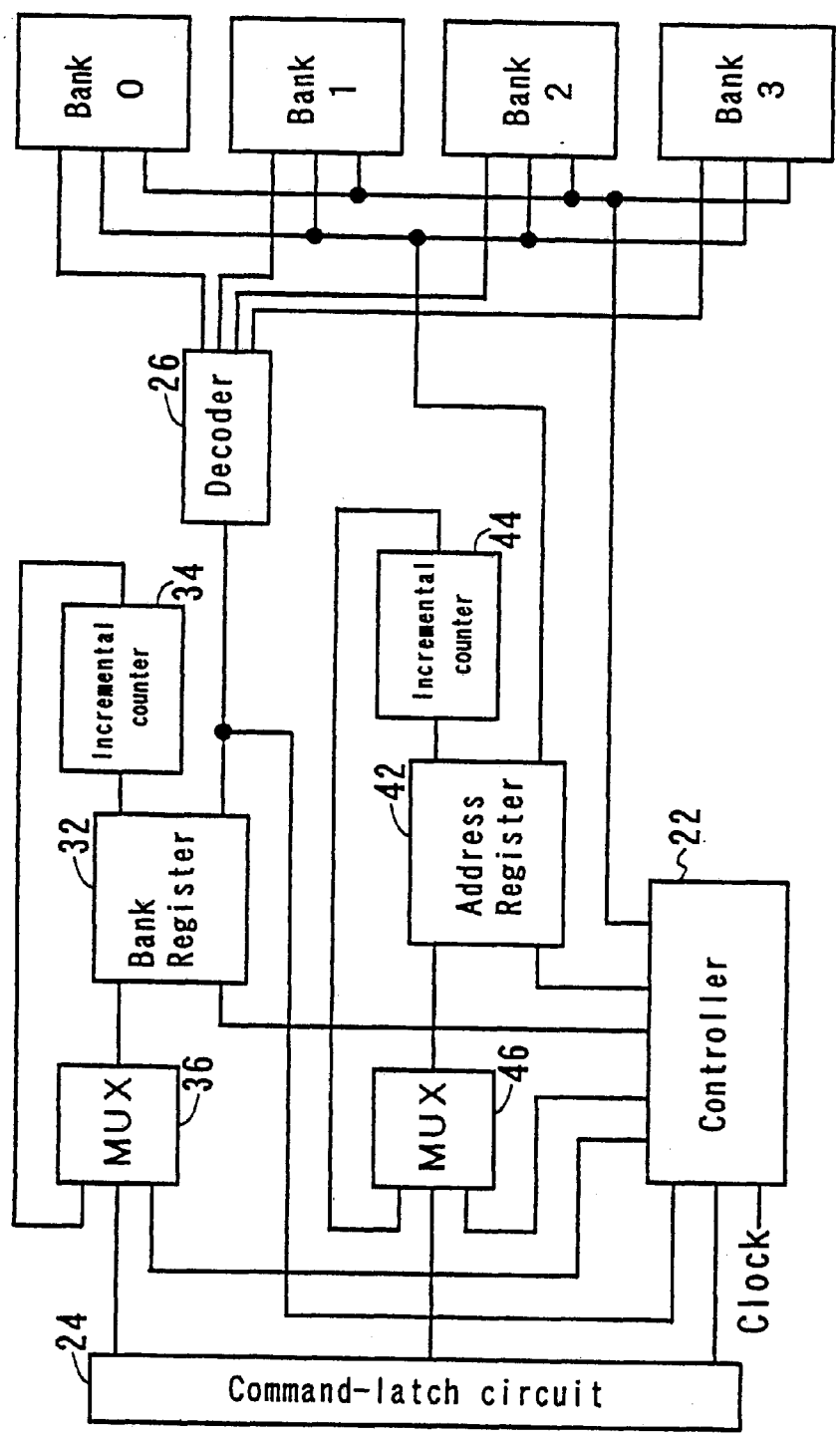
FIG. 1 is a block diagram illustrating an embodiment of the SDRAM in accordance with the present invention.

Generally, to make a seamless access on different row addresses of a single bank, it is necessary to have a long burst-length, and the whole or a fraction of the burst data are prefetched. For example, suppose a case where a-16-bit burst can realize the seamless operation in a single bank structure, in this case, 8-bit-burst becomes seamless with 2 banks. Likewise 4-bit burst with 4 banks also can be seamless. Accordingly, assume that the burst-length of a single bank is LSB and the burst-length is LB when the number of banks is NB, then, $$LSB = LB \times NB$$

In the present invention, the practical burst-length obtained by the above equation and the number of banks are optimally selected. As an example of the materializing method, when one line of a cache comprises 256 bits, considering that a memory-bus comprises 32-bits is stored in a bank, the burst-length should be 8-bits. As was described above, if a-16- bit burst is provided, 4-banks are provided with 4-bit burst and 2-banks with 8-bit burst. Accordingly, when a-8-bit burst and 4 of the bank number are provided, it is possible to perform seamless accesses in a variety of operating modes. In the form of embodying the invention, an explanation is given by referring to an example in which access is performed to an SDRAM comprising 8-bit burst and 4 banks consisting of bank 0, bank 1, bank 2, and bank 3.

FIG. 1 illustrates an SDRAM in accordance with the present invention, in which each bank is connected to a bank register 32 by an address register 42 and a decoder 26. Data of a specified bank are output to the bank register 32 and data of the specified address to the address register 42. The address register 42 stores addresses of data accessed by each bank. An incremental counter 44 is connected to the address register 42. When an access to data shown by the address register 42 is performed, information of the address register 42 is rewritten into an address following the data access. Since the embodiment provides 8 of burst length, an access is performed to the data of 8 continuous addresses including the initial access.

The bank register 32 stores information of banks to be accessed. In this embodiment, information showing any of the bank 0, bank 1, bank 2, and the bank 3 is stored. The incremental counter 34 is connected to the bank register 32. When having accessed any bank specified by the bank register 32, the incremental counter 34 rewrites information of the address register 32 into an address following the data access. In this embodiment, accesses are performed by the sequence of the bank 0, bank 1, bank 2, and the bank 3. Note that after accessing the last bank 3, the access sequence is back to the initial bank 0. In regard to bank information, for example, the bank number "n" illustrating nth bank (where n is 0, 1, 2, or 3) is memorized by the bank register 32, and then the incremental counter 34 increases n one by one. Note that when n has become 4, the count is reset to 0. The bank number n is input to the decoder 26, thus specifying the nth bank.

The bank register 32 and the incremental counter 34 are connected to a multiplexer (MUX) 36, whereas the address register 42 and the incremental counter 44 are connected to a multiplexer (MUX) 46. The MUX 36 and the MUX 46 are connected to a command-latch circuit 24. The banks, the address register 42, the bank register 32, the incremental counters 34 and 44, the MUX 36, the MUX 46, and the command-latch circuit 24 are connected to a controller 22. In the SDRAM, the burst-length can be set to 2, 4, or 8 by a mode register. Simultaneous with the initial address, a bank address is also specified at the access moment. A command is required to access and precharge banks. The controller 22 includes an address/bank increment circuit which, after completing an access to a bank, automatically precharges the bank and shifts an access to the following bank. Because of this, no precharge command is needed for the banks.

Figure 2:
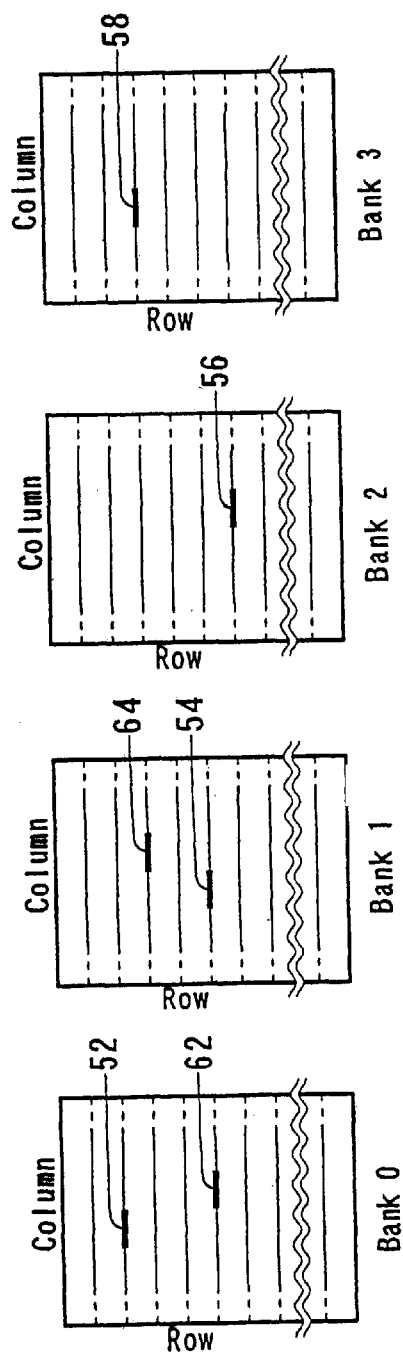
FIG. 2 are charts respectively illustrating an example of data access of the SDRAM shown in FIG. 1.

Regarding the case of accessing the SDRAM, its operation is described below. Assume that the bank number preserved by the bank register 32 is 0, an access is performed to data of an address preserved by the address register 42 inside of the bank. After the access is completed, the following address is specified by the incremental counter 44. In this embodiment, the address is specified by 7 times. As shown in FIG. 2, accesses are performed to data 52 of 8 consecutive addresses including the initial data.

When having terminated an access to the data 52 corresponding to the burst-length portion of the bank 0, the bank 0 is precharged by an internal circuit without external command. Simultaneously, the bank number 1 is specified by the incremental counter 34. Like the bank 0, an access is performed to data 54 corresponding to the burst-length portion specified by the address register 42 of the bank 1. In the same way, an access is further performed to data 56 corresponding to the burst-length portion of the bank 2, and then, an access is further performed to data 58 corresponding to the burst-length portion of the bank 3. When having terminated the accesses to respective banks, precharge of banks is automatically executed.

When having terminated an access to the bank 3, the bank number 0 is again specified by the bank register 32. Further, an address following the data 52 corresponding to the burst-length portion through with the access in the last round is specified by the address register 42. Accordingly, an access is performed to data 62 corresponding to the burst-length portion following the address of data 52 through with the access in the last round. In the same way, an access is further performed to data 64 corresponding to the burst-length portion following the address of data 54 of the bank 1 through with the access in the last round.

Figure 3:
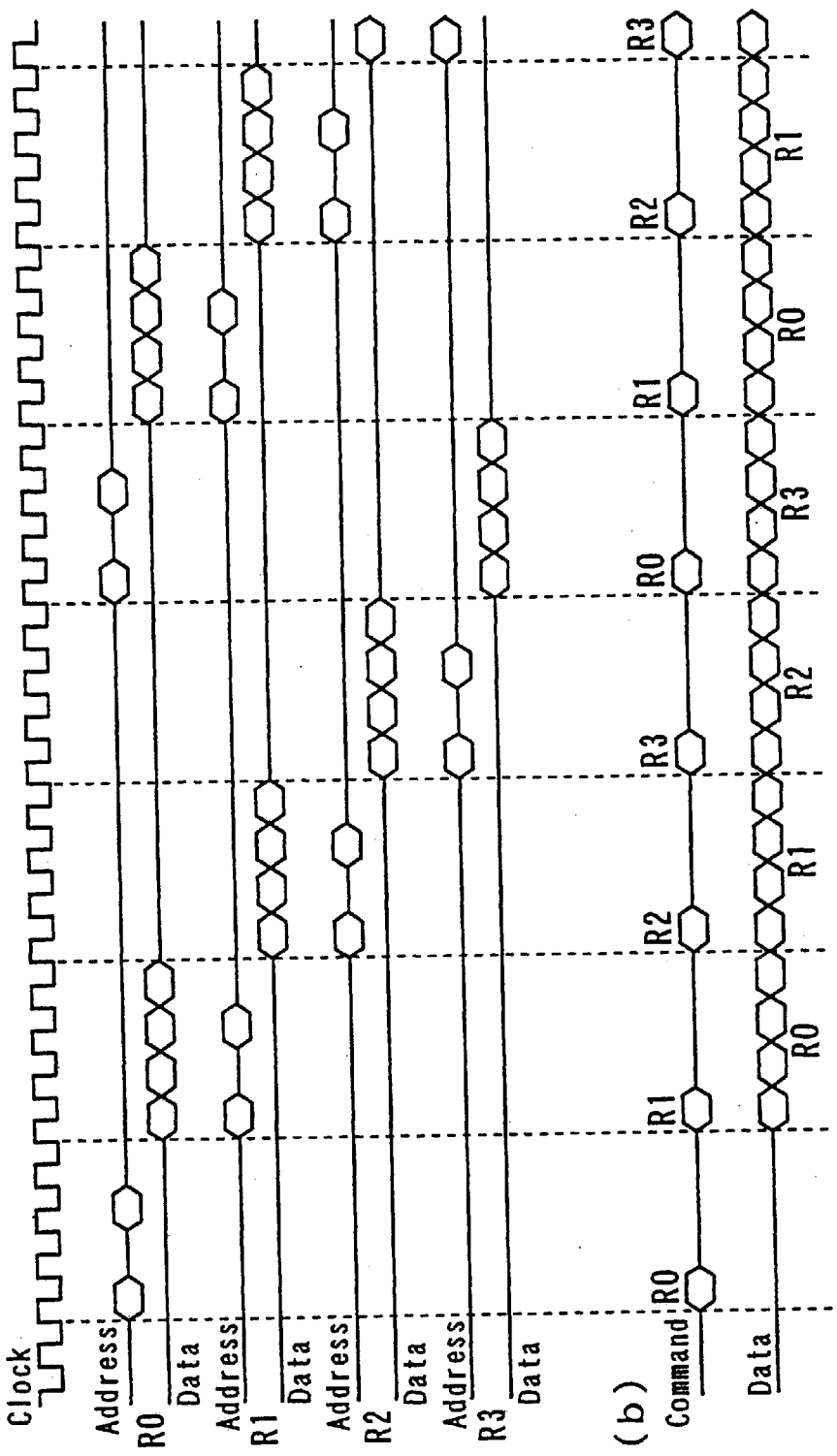
FIGS. 3 (a) and (b) are timing charts illustrating examples of data accesses (read) of the SDRAM shown in FIG. 1.

FIG. 3 (*a*) is a timing chart illustrating an access operation using 4 banks by solely using 4-bit-portions among 8-bit bursts. R0, R1, R2, and R3 represent accesses to the bank 0, bank 1, bank 2, and the bank 3. By circulating the banks while accessing a 4-bit burst-length per bank, as shown in FIG. 3(*b*), a seamless and continuous access can be realized. In this way, even when accessing a different row address with a short burst- length such as 4-bits, a seamless operation can be realized.

Figure 4A:
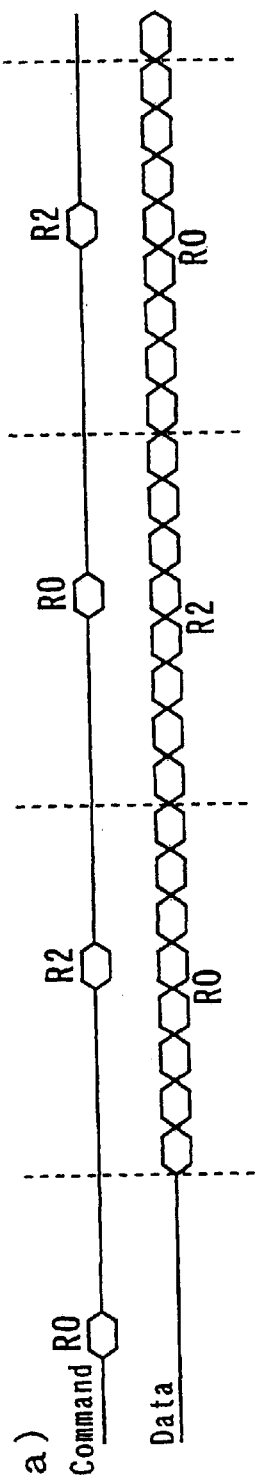
FIGS. 4 (a) and (b) are timing charts illustrating another examples of data accesses (read) of the SDRAM shown in FIG. 1.
Figure 4B:
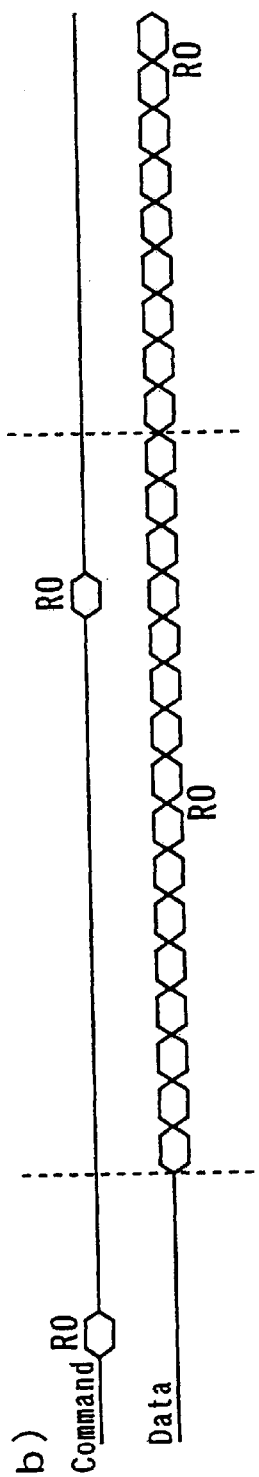

FIG. 4 (*a*) illustrates accesses to 8-bit bursts by using 2 banks (R0 and R2). If only a-8-bit burst is present, even when 2 banks are used, seamless accesses can be realized. FIG. 4(*b*) illustrates when 16-bit bursts are obtained by a single access command. Bank-incremental function is utilized for a command given at R0 in order that the access can be performed with 16-bit bursts being the sum of each 8-bit bursts of R0 and R2. Using a command of R0, a discrete initial address is specified per bank R0 and R2. In FIG. 3, an independent command is used for R0, R1, R2, and R3. In FIG. 4 (*b*), accesses are sequentially performed to R1, R2, and R3 by solely using command of R0. Activation of each bank can be executed by precharge after these accesses.

Figure 5:
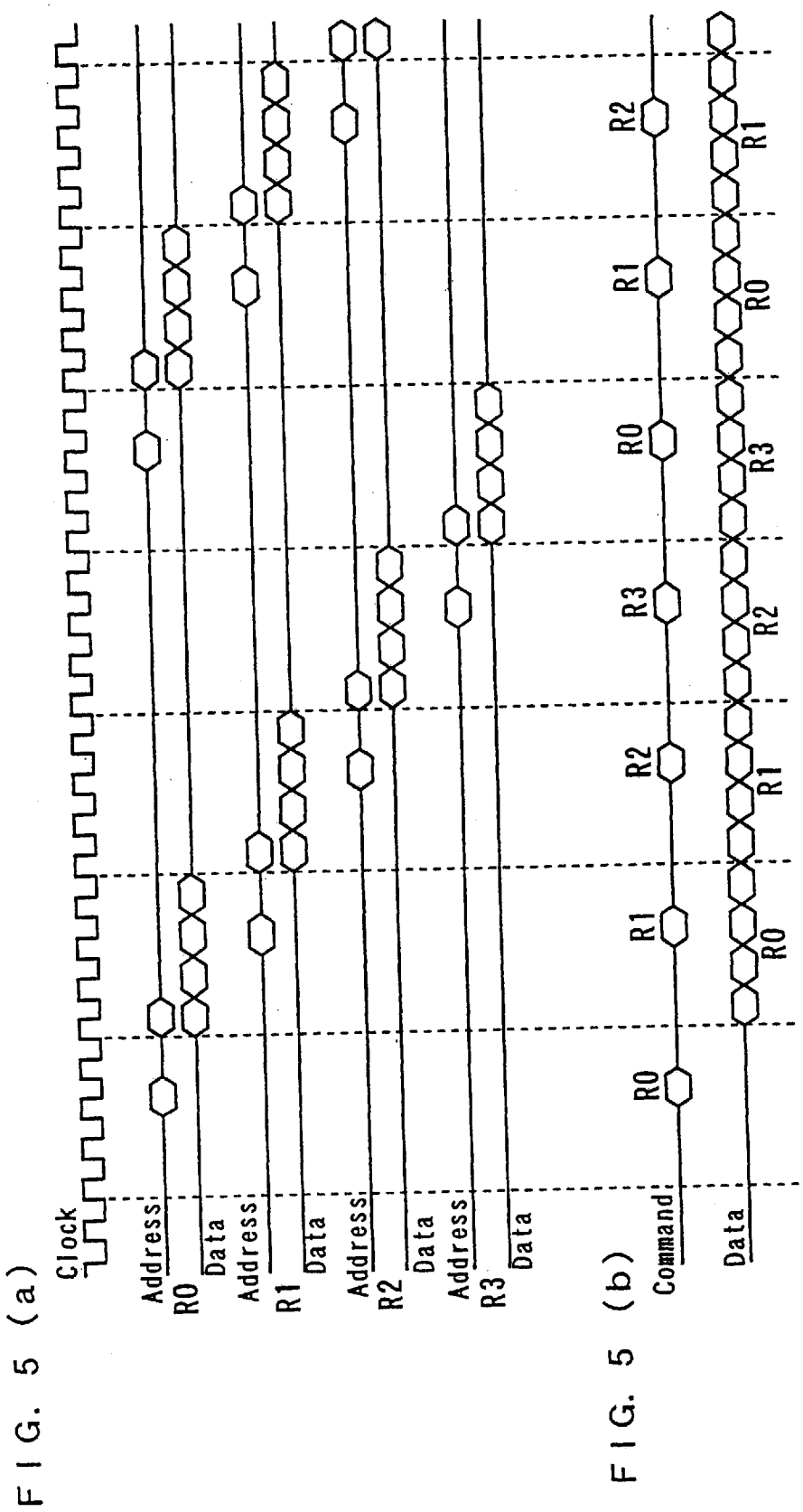
FIGS. 5 (a) and (b) are timing charts illustrating examples of data accesses (write) of the SDRAM shown in FIG. 1.
Figure 7A:
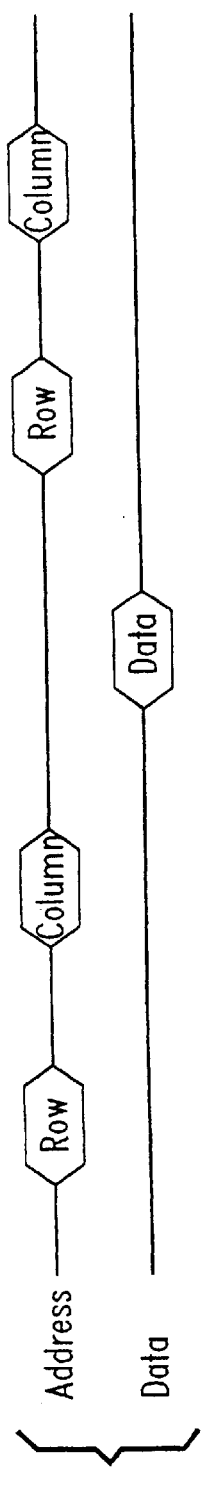
FIGS. 7 (a) and (b) are timing charts illustrating a summary of data access of an SDRAM.
Figure 7B:
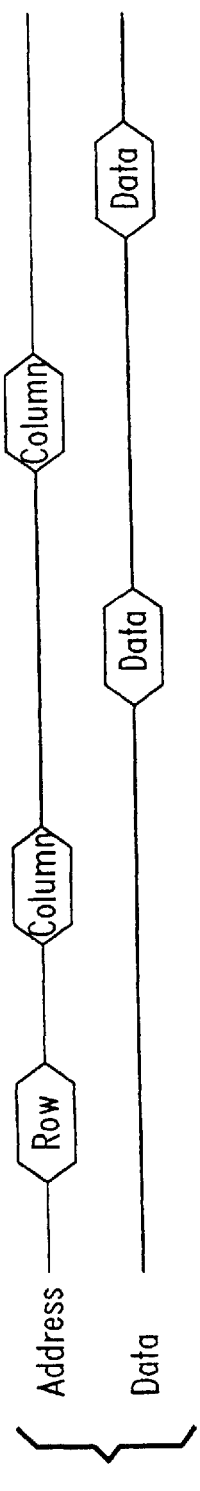
Figure 8:
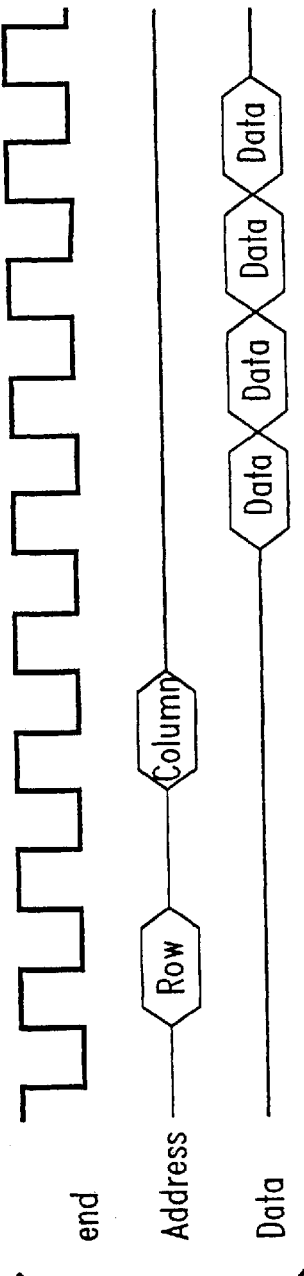
FIG. 8 is a timing chart illustrating a summary of data access of the SDRAM.
Figure 9:
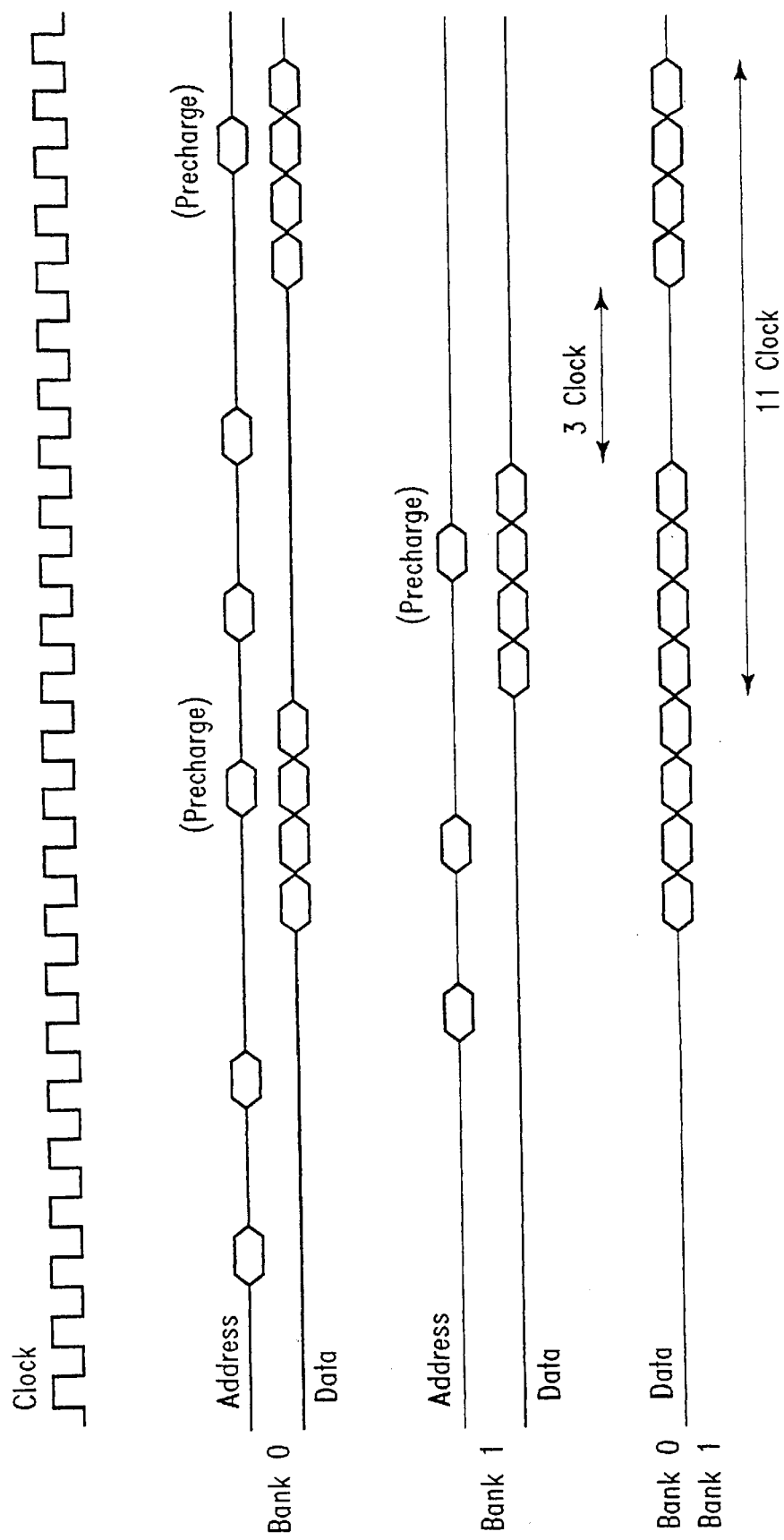
FIG. 9 is a timing chart illustrating examples of accesses to data of different row addresses between banks.
Figure 10:
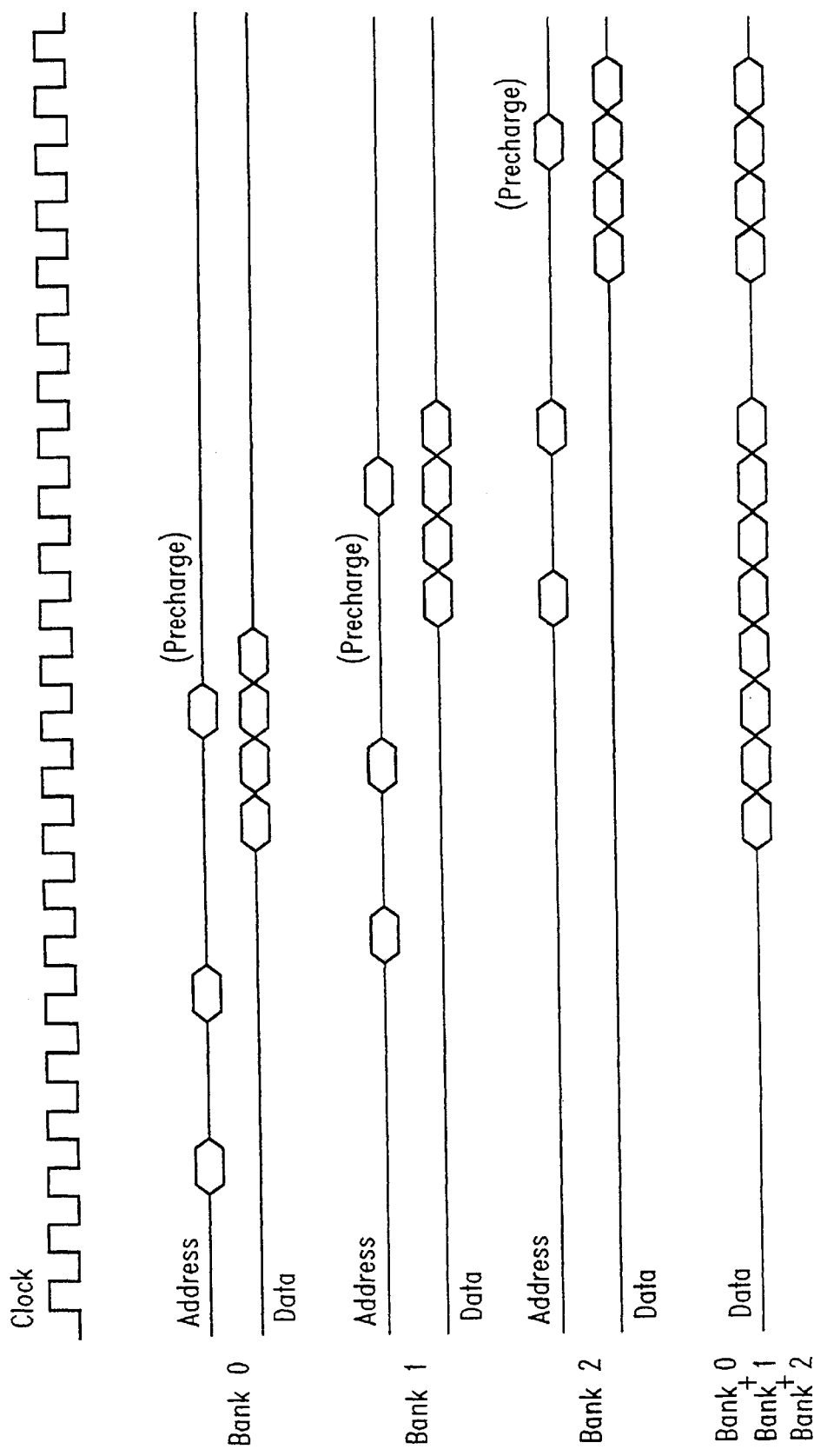
FIG. 10 is a timing chart illustrating another examples of accesses to data of different row addresses between banks.

FIGS. 5 (*a*)/(*b*) and FIGS. 6 (*a*)/(*b*) respectively illustrate operations similar to FIGS. 3 (*a*)/(*b*) and FIGS. 4 (*a*)/(*b*) at the write time. In this way, if only clock slots of a read and a write are alternately determined, and yet, by providing a burst-length to be double the above referred case in a separate way between the read and the write, even when row addresses are different, a seamless and simultaneously executable access in the read and the write can be materialized. As another method, by setting the maximum burst-length by a mode-register, data corresponding to the setup burst-length can be read and written.

In this way, in a memory chip having a plurality of banks, by optimizing the number of burst bits and the number of banks for continuously writing and reading data per bank, it is possible to realize a read/write by constantly seamless burst-mode across a plurality of banks. Further, by fixing a burst-length per bank and providing a single access command with a function for accessing/precharging to a plurality of banks in the predetermined sequence, it is possible to realize the transmission of the burst-mode between different rows at a speed identical to the access to columns of the page-mode.

According to the SDRAM of the present invention, while changing a bank to be accessed based on the predetermined sequence, it is possible to access data of continuous addresses corresponding to a burst-length portion in each bank. When having terminated an access to a bank, the bank can be precharged automatically. By executing the data-access method by accessing banks based on the predetermined sequence and data of continuous addresses corresponding to the burst-length portion in each bank followed by a step of automatically precharging banks, even in the case of different row addresses between banks, seamless accesses can be realized.

A variety of embodiments for the SDRAM and the method for data accesses of the SDRAM related to the present invention have thus been described by referring to the drawings. It should be understood that the invention is not limited to the illustrated SDRAM and the method for accessing data of the SDRAM. Further, the invention can be embodied by adding a variety of improvements, modifications, and changes, based on knowledges of those skilled in the art within a scope that does not deviate from the essentials of the invention.

What is claimed is:

1. An SDRAM having a plurality of banks comprising;
   a bank-specifying means for specifying a bank to be accessed;
   an address-specifying means for specifying an address of data inside said specified bank to be accessed;
   a bank-changing means for varying a bank specified by said bank-specifying means as per predetermined sequence; and
   an address-changing means for varying an address specified by said address-specifying means across a predetermined number of data inside said specified bank.

2. The SDRAM according to claim 1, wherein said address-changing means varies an address specified by said address-designating means by a burst length.

3. The SDRAM according to claim 2, which includes a precharging means for precharging a bank specified by said bank-specifying means after completing an access to the said bank.

4. A method for data accesses of an SDRAM having a plurality of banks comprising;
   a step of specifying a bank to be accessed;
   a step of specifying an address of data inside said specified bank to be accessed;
   a step of accessing said specified bank as per a predetermined sequence; and a step of data accesses of said specified address inside said specified bank across a predetermined number of data.

5. The method for data accesses of an SDRAM according to claim 4, wherein said step of accessing said data by a burst length.

6. The method for data accesses of an SDRAM according to claim 5 further comprising a step of precharging said bank after completing said bank-accessing step.

* * * * *